United States Patent
Matsuo et al.

(10) Patent No.: US 9,414,521 B2
(45) Date of Patent: Aug. 9, 2016

(54) HEAT SOURCE SYSTEM AND METHOD OF CONTROLLING FLOW RATE OF HEATING MEDIUM THEREOF

(71) Applicant: MITSUBISHI HEAVY INDUSTRIES, LTD., Tokyo (JP)

(72) Inventors: Minoru Matsuo, Tokyo (JP); Satoshi Nikaido, Tokyo (JP); Koki Tateishi, Tokyo (JP); Toshiaki Ouchi, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 229 days.

(21) Appl. No.: 14/365,939

(22) PCT Filed: Feb. 26, 2013

(86) PCT No.: PCT/JP2013/054845
§ 371 (c)(1),
(2) Date: Jun. 16, 2014

(87) PCT Pub. No.: WO2013/129349
PCT Pub. Date: Sep. 6, 2013

(65) Prior Publication Data
US 2014/0360714 A1 Dec. 11, 2014

(30) Foreign Application Priority Data
Feb. 28, 2012 (JP) ................................. 2012-042313

(51) Int. Cl.
*F24F 3/06* (2006.01)
*H05K 7/20* (2006.01)
(Continued)

(52) U.S. Cl.
CPC ........ *H05K 7/20272* (2013.01); *F24D 19/1012* (2013.01); *F24D 19/1021* (2013.01);
(Continued)

(58) Field of Classification Search
CPC ........... F24F 3/06; G05B 15/02; G05B 19/20; F04D 15/029; F04D 41/06

USPC ........ 122/1 C, 406.1, 406.2, 406.3, 414, 415, 122/448.2, 451.1; 165/284, 297, 80.4
See application file for complete search history.

(56) References Cited

U.S. PATENT DOCUMENTS 3,729,051 A * 4/1973 Mannion ................. F24F 11/06
137/486
4,552,099 A * 11/1985 Martens ................ F01K 23/108
122/406.4
(Continued)

FOREIGN PATENT DOCUMENTS

CN 101354171 A 1/2009
JP 2004-184052 A 7/2004
(Continued)

OTHER PUBLICATIONS

Extended European Search Report dated Dec. 9, 2015, issued in counterpart European Patent Application No. 13755926.6 ( 8 pages).
(Continued)

*Primary Examiner* — Gregory A Wilson
(74) *Attorney, Agent, or Firm* — Westerman, Hattori, Daniels & Adrian, LLP

(57) ABSTRACT

It is possible to realize flow rate control regardless of the scale on a load side or a piping system and to achieve energy saving. In a host control device (20) of a heat source system, a bypass valve opening command value is determined by an opening command value determination unit (22) such that a header differential pressure matches a target differential pressure value, and a target opening value according to the header differential pressure or the behavior of the bypass valve opening is set by a target opening value setting unit (24). A heating medium flow rate set value is determined by a heating medium flow rate setting unit (23) using the target opening value set by the target opening value setting unit (24) and the opening command value determined by the opening command value determination unit (22).

5 Claims, 8 Drawing Sheets

(51) Int. Cl.
*F24F 11/00* (2006.01)
*F24D 19/10* (2006.01)

(52) U.S. Cl.
CPC .......... *F24D19/1036* (2013.01); *F24F 11/008* (2013.01); *H05K 7/20281* (2013.01); *Y02B 30/745* (2013.01)

(56) References Cited

U.S. PATENT DOCUMENTS

| | | | | |
|---|---|---|---|---|
| 6,904,874 | B1* | 6/2005 | Pouchak | F24H 9/2035 122/447 |
| 9,032,748 | B2* | 5/2015 | Lau | F04D 15/029 417/3 |
| 2010/0170274 | A1* | 7/2010 | Ueda | F04D 27/0261 62/238.6 |
| 2013/0037249 | A1* | 2/2013 | Manzo | F24D 19/1006 165/200 |
| 2013/0312671 | A1* | 11/2013 | Deivasigamani | G06F 17/30902 122/1 C |

FOREIGN PATENT DOCUMENTS

| | | |
|---|---|---|
| JP | 2006-220363 A | 8/2006 |
| JP | 3987358 B2 | 10/2007 |
| JP | 2009-204262 A | 9/2009 |
| JP | 2011-94937 A | 5/2011 |
| JP | 2011-127859 A | 6/2011 |
| JP | 2011-169533 A | 9/2011 |

OTHER PUBLICATIONS

Notice of Allowance dated Jan. 21, 2016, issued in counterpart Korean Patent Application No. 9-5-2016-005561202, w/English translation (4 pages).
International Search Report dated Jun. 4, 2013 issued in correponding application No. PCT/JP2013/054845.
Written Opinion of the International Searching Authority dated Jun. 4, 2013 issued in correponding application No. PCT/JP2013/054845.
Decision to Grant a Patent dated Oct. 5, 2015 issued in counterpart Japanese patent application No. 2012-042313, (3 pages). Explanation of relevancy—"The Decision to Grant a Patent has been received."

* cited by examiner

HEAT SOURCE SYSTEM AND METHOD OF CONTROLLING FLOW RATE OF HEATING MEDIUM THEREOF

TECHNICAL FIELD

The present invention relates to a heat source system and a method of controlling a flow rate of a heating medium thereof.

BACKGROUND ART

In the related art, as a method of controlling a flow rate of a heating medium in a heat source system, for example, a method disclosed in PTL 1 is known. PTL 1 discloses a heat source system including a pump operation state control device which controls a rotational speed of an inverter-driven liquid feed pump, and a flow rate control device which controls a flow rate of a heating medium of each load piping system. In this heat source system, the operation state control device of the liquid feed pump outputs a command for full opening of a valve to a flow rate control valve of the load piping system which becomes a maximum heating medium flow rate, controls the rotational speed of the liquid feed pump so as to obtain a desired flow rate, and controls a flow rate of a different piping system with a small required flow rate by the opening of each flow rate control valve.

CITATION LIST

Patent Literature

[PTL 1] Japanese Unexamined Patent Application Publication No. 2011-127859

SUMMARY OF INVENTION

Technical Problem

In the method disclosed in PTL 1, since valve control in the load piping system also becomes a control target, it is necessary to customize the flow rate control device in accordance with the scale of the load or the piping system.

An object of the invention is to provide a heat source system and a method of controlling a flow rate of a heating medium thereof capable of realizing heating medium flow rate control regardless of the scale on the load side or a piping system and achieving energy saving.

Solution to Problem

A first aspect of the invention provides a heat source system including heat source means for producing a heating medium at a desired temperature and supplying the heating medium to a load, a first pipe which supplies the heating medium from the heat source means to the load, a supply header which is provided in the first pipe, a second pipe which supplies the heating medium used by the load to the heat source means, a return header which is provided in the second pipe, a bypass pipe which bypasses the heating medium from the supply header to the return header, a bypass valve which is provided in the bypass pipe and adjusts the bypass flow rate of the heating medium, a pump which is provided on an upstream side of a heating medium flow from the supply header in the first pipe or on a downstream side of a heating medium flow from the return header in the second pipe and has a variable rotational speed, and control means for adjusting the opening of the bypass valve, in which the control means includes opening command value determination means for determining a bypass valve opening command value such that a header differential pressure which is the differential pressure between the supply header and the return header matches a target differential pressure value, target opening value setting means for setting a target opening value according to the header differential pressure or the behavior of the bypass valve opening, and heating medium flow rate setting means for holding an opening-flow rate characteristic in which the relationship between a bypass valve opening command value and a heating medium flow rate set value is defined in association with a target opening value, and acquiring the heating medium flow rate set value corresponding to the opening command value determined by the opening command value determination means using an opening-flow rate characteristic corresponding to the target opening value set by the target opening value setting means, and the frequency control of the pump is performed in accordance with the heating medium flow rate set value.

According to the invention, the bypass valve opening command value is determined by the opening command value determination means such that the header differential pressure matches the target differential pressure value, and the target opening value according to the header differential pressure or the behavior of the bypass valve opening is set by the target opening value setting means. Then, the heating medium flow rate set value is determined by the heating medium flow rate setting means using the target opening value set by the target opening value setting unit and the opening command value determined by the opening command value determination means. Accordingly, it becomes possible to allow the heating medium flow rate control to be completed on the heat source system side. As a result, it is not necessary to customize the adjustment of the bypass valve opening or the frequency control of the pump on the heat source system side in accordance with the scale or structure of an external load, and it is possible to provide a versatile system.

In the above-described heat source system, the target opening value setting means may decrease the current target opening value when the deviation between the bypass valve opening and the target opening value is within a predetermined range set in advance, and the state where the header differential pressure is equal to or smaller than the target differential pressure value is maintained for a predetermined first period, and the opening-flow rate characteristic may be set such that, as the target opening value decreases, the heating medium flow rate set value for the same bypass valve opening command value decreases.

According to the above-described configuration, when the deviation between the bypass valve opening and the target opening value is within a predetermined range, and the state where the header differential pressure is equal to or smaller than the target differential pressure value is maintained for the first period, the current target opening value decreases. That is, in a state where the header differential pressure is equal to or smaller than the target differential pressure value, this represents a state where the bypass flow rate is excess, in other words, a state where the bypass valve may be somewhat narrowed down. Accordingly, in this state, the target opening value decreases, thereby decreasing the heating medium flow rate set value which is obtained from the opening-flow rate characteristic. Therefore, it is possible to decrease the frequency of the pump and to achieve energy saving.

The above-described heat source system may further include target differential pressure value setting means for calculating a header differential pressure corresponding to a heating medium flow rate according to the deviation between the bypass valve opening and the target opening value when the bypass valve opening is greater than the target opening value, and decreases the target differential pressure value using the header differential pressure as a correction value, in which the target opening value setting means may have a differential pressure-opening characteristic in which the relationship between the header differential pressure and the bypass valve opening is defined, when the target differential pressure value is changed by the target differential pressure value setting means, may acquire a bypass valve opening corresponding to the changed target differential pressure value from the differential pressure-opening characteristic, and may set the acquired bypass valve opening as the target opening value, and the differential pressure-opening characteristic may be set such that, as the target differential pressure value decreases, the target opening value decreases.

According to the above-described configuration, when the bypass valve opening is greater than the target opening value, the target differential pressure value decreases using the bypass valve opening as a correction value, and the target opening value decreases with the change of the target differential pressure value. In this way, the target opening value is changed in a decreasing direction, whereby it becomes possible to decrease the heating medium flow rate set value which is obtained from the opening-flow rate characteristic. Accordingly, it is possible to decrease the frequency of the pump and to achieve energy saving.

A second aspect of the invention provides a method of controlling a flow rate of a heating medium which is applied to a heat source system, in which the heat source system includes heat source means for manufacturing a heating medium at a desired temperature and supplying the heating medium to a load, a first pipe which supplies the heating medium from the heat source means to the load, a supply header which is provided in the first pipe, a second pipe which supplies the heating medium used by the load to the heat source means, a return header which is provided in the second pipe, a bypass pipe which bypasses the heating medium from the supply header to the return header, a bypass valve which is provided in the bypass pipe and adjusts the bypass flow rate of the heating medium, a pump which is provided on an upstream side of a heating medium flow from the supply header in the first pipe or on a downstream side of a heating medium flow from the return header in the second pipe and has a variable rotational speed, and control means for adjusting the opening of the bypass valve, the method includes an opening command value determination step of determining a bypass valve opening command value such that a header differential pressure which is the differential pressure between the supply header and the return header matches a target differential pressure value, a target opening value setting step of setting a target opening value according to the header differential pressure or the behavior of the bypass valve opening, and a heating medium flow rate setting step of holding an opening-flow rate characteristic in which the relationship between a bypass valve opening command value and a heating medium flow rate set value is defined in association with a target opening value, and acquiring the heating medium flow rate set value corresponding to the opening command value determined in the opening command value determination step using the opening-flow rate characteristic corresponding to the target opening value set in the target opening value setting step, and the frequency control of the pump is performed in accordance with the heating medium flow rate set value.

Advantageous Effects of Invention

According to the invention, it is possible to realize flow rate control regardless of the scale on the load side or the piping system and to achieve energy saving.

DESCRIPTION OF EMBODIMENTS

[First Embodiment]

Figure 1:
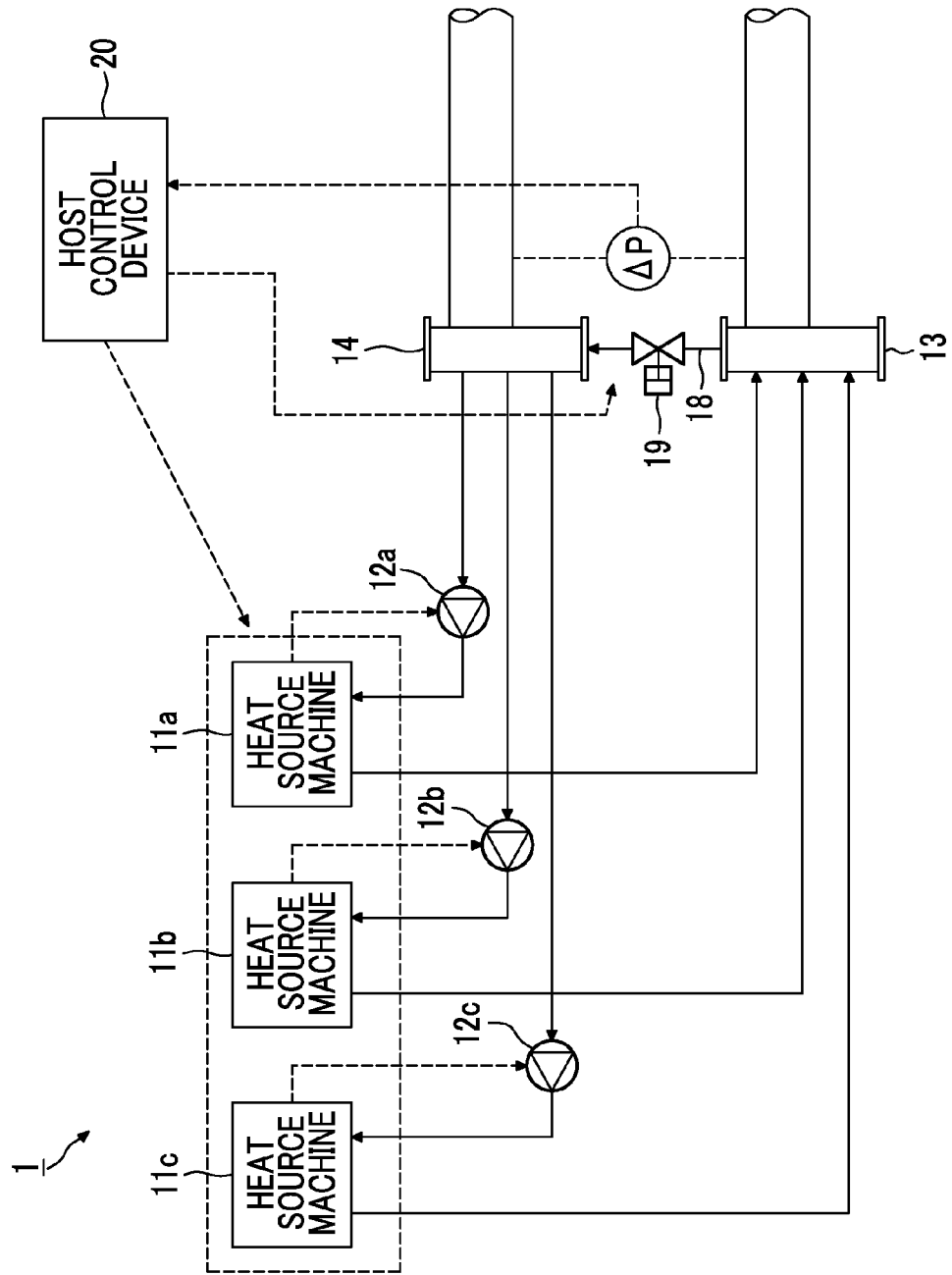
FIG. 1 is a diagram schematically showing the configuration of a heat source system according to a first embodiment of the invention.

Hereinafter, a heat source system and a method of controlling a flow rate of a heating medium thereof according to a first embodiment of the invention will be described referring to the drawings.

FIG. 1 is a diagram schematically showing the configuration of a heat source system according to the first embodiment of the invention. As shown in FIG. 1, a heat source system 1 includes a plurality of heat source machines 11a, 11b, and 11c which cools or heats a heating medium (chilled or hot water) to be supplied to an external load, for example, an air conditioner, a water heater, a plant facility, or the like. In FIG. 1, although a case where three heat source machines 11a, 11b, and 11c are provided is illustrated, the number of heat source machines may be arbitrarily determined.

On the upstream side of the respective heat source machines 11a, 11b, and 11c when viewed from the heating medium flow, pumps 12a, 12b, and 12c which pump the heating medium are provided. The heating medium from a return header 14 is fed to the heat source machines 11a, 11b, and 11c by the pumps 12a, 12b, and 12c. Each of the pumps 12a, 12b, and 12c is driven by an inverter motor (not shown), and thus, the rotational speed is variable to perform variable flow rate control.

The heating medium which is cooled or heated by the respective heat source machines 11a, 11b, and 11c is gathered in a supply header 13. The heating medium gathered in the supply header 13 is supplied to the external load. The heating medium which is used for an air conditioning or the like by the external load and is heated or cooled is fed to the return header 14. The heating medium branches off in the return header 14 and is fed to the heat source machines 11a, 11b, and 11c again.

A bypass pipe 18 is provided between the supply header 13 and the return header 14. The bypass pipe 18 is provided with a bypass valve 19 for adjusting a bypass flow rate.

The valve opening control of the bypass valve 19 and the inverter control of the pumps 12a, 12b, and 12c are carried out by a host control device (control means) 20.

Figure 2:
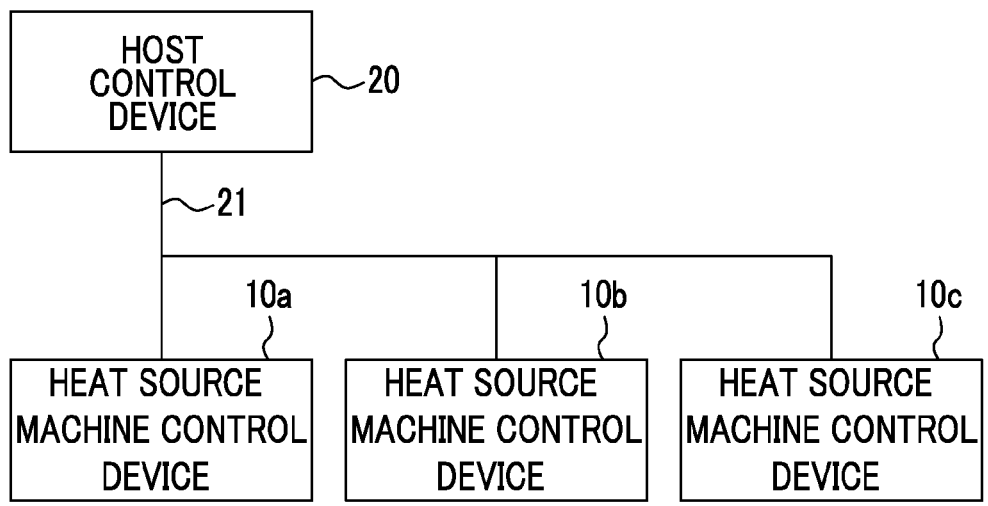
FIG. 2 is a diagram schematically showing the configuration of a control system of the heat source system shown in FIG. 1.

FIG. 2 is a diagram schematically showing the configuration of a control system of the heat source system 1 shown in FIG. 1. As shown in FIG. 2, heat source machine control devices 10a, 10b, and 10c which are the control devices of the respective heat source machines 11a, 11b, and 11c are connected to the host control device 20 through a communication medium 21, and bi-directional communication is possible. For example, the host control device 20 is a control device which performs overall control of the entire heat source system 1, controls the valve opening of the bypass valve 19 on the basis of the differential pressure (hereinafter, referred to as "header differential pressure") between the supply header 13 and the return header 14, and provides a heating medium flow rate set value, which is a command for causing the heat source machine control devices 10a, 10b, and 10c to perform rotational speed control of the pumps 12a, 12b, and 12c, to the heat source machines 11a, 11b, and 11c. The host control device 20 may perform, for example, number-of-heat source machines control for controlling the number of heat source machines 11a, 11b, and 11c which are activated for a required load of the external load.

The host control device 20 and the heat source machine control devices 10a, 10b, and 10c are, for example, a computer, and include a CPU (Central Processing Unit), a main storage device, such as a RAM (Random Access Memory), an auxiliary storage device, a communication device which performs communication with an external apparatus to transfer information, and the like.

The auxiliary storage device is a computer-readable storage medium, and is, for example, a magnetic disk, a magneto-optical disk, a CD-ROM, a DVD-ROM, a semiconductor memory, or the like. The auxiliary storage device stores various programs, and the CPU reads the programs from the auxiliary storage device to the main storage device and executes the programs to realize various kinds of processing.

Figure 3:
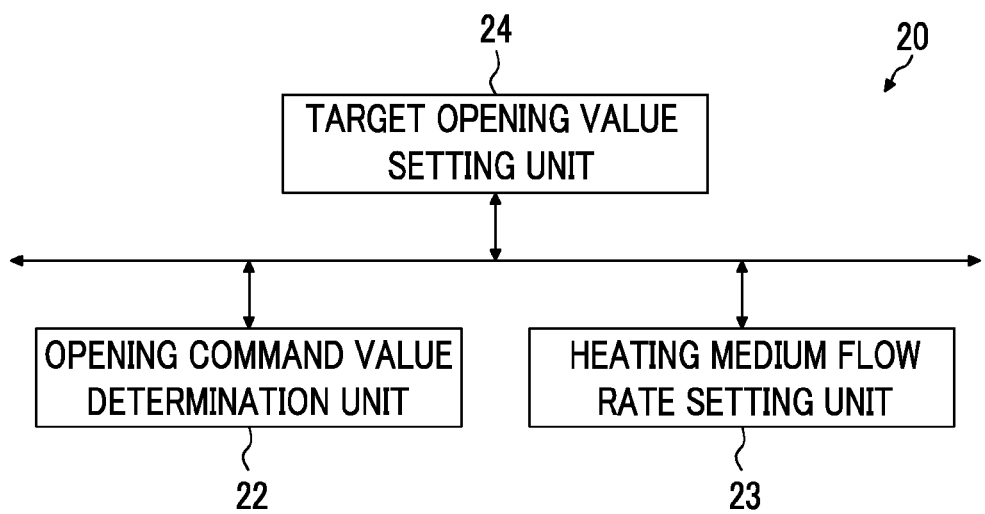
FIG. 3 is a functional block diagram primarily showing a function related to valve opening control of a bypass valve among various control functions of a host control device.

FIG. 3 is a functional block diagram primarily showing a function related to valve opening control of the bypass valve 19 among various control functions of the host control device 20.

As shown in FIG. 3, the host control device 20 includes an opening command value determination unit 22, a heating medium flow rate setting unit 23, and a target opening value setting unit 24.

Figure 4:
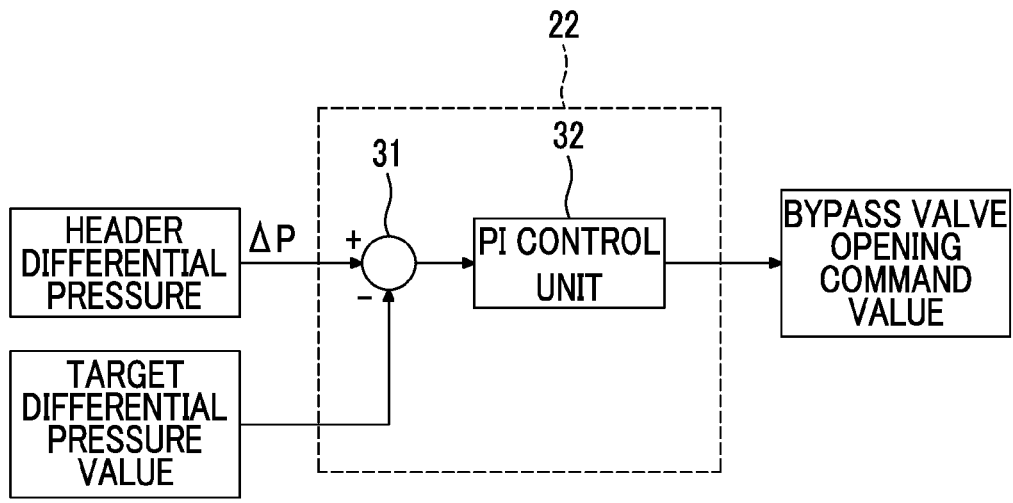
FIG. 4 is a diagram showing one configuration example of an opening command value determination unit shown in FIG. 3.

The opening command value determination unit 22 determines a bypass valve opening command value such that a target differential pressure value set in advance matches a header differential pressure ΔP. Specifically, as shown in FIG. 4, the opening command value determination unit 22 includes a deviation calculation unit 31 which calculates the deviation (difference) between the target differential pressure value and the header differential pressure ΔP, and a PI control unit 32 which performs PI control on the differential pressure. The output of the PI control unit 32 is provided to the bypass valve 19 as a bypass valve opening command value, and is output to and used in the heating medium flow rate setting unit 23.

Figure 5:
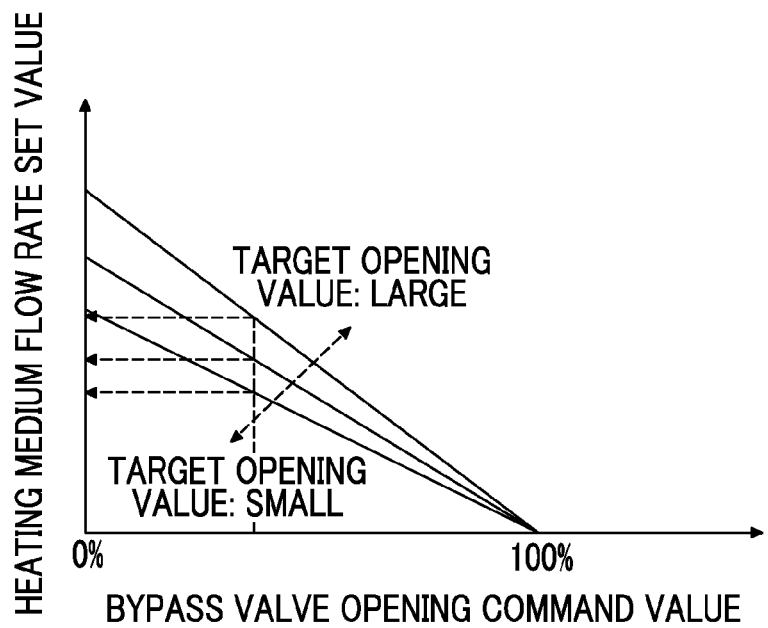
FIG. 5 is a diagram showing an example of an opening-flow rate characteristic.

The heating medium flow rate setting unit 23 holds an opening-flow rate characteristic in which the relationship between a bypass valve opening command value and a heating medium flow rate set value is defined in association with a target opening value. FIG. 5 shows an example of an opening-flow rate characteristic. In FIG. 5, the horizontal axis represents a bypass valve opening command value, and the vertical axis represents a heating medium flow rate set value. The opening-flow rate characteristic has a feature that, as the bypass valve opening command value increases, the heating medium flow rate set value decreases, and is set such that, as the target opening value decreases, the heating medium flow rate set value for the same bypass valve opening command value decreases. In other words, setting is made such that the higher the target opening value, the larger the inclination.

The opening-flow rate characteristic may be held as a table as shown in FIG. 5 or may be held as an arithmetic expression of the heating medium flow rate set value including the target opening value and the bypass valve opening command value as parameters.

The heating medium flow rate setting unit 23 acquires the heating medium flow rate set value corresponding to the bypass valve opening command value determined by the opening command value determination unit using the opening-flow rate characteristic corresponding to the target opening value set by the target opening value setting unit 24 described below.

For example, the acquired heating medium flow rate set value is transmitted from the host control device 20 to each of the heat source machine control devices 10a, 10b, and 10c, and the frequency control of each of the pumps 12a, 12b, and 12c based on the heating medium flow rate set value is performed. The rotational speed of each of the pumps 12a, 12b, and 12c is controlled such that the total flow rate fed from the respective pumps becomes the heating medium flow rate set value.

The target opening value setting unit 24 sets the target opening value according to the header differential pressure ΔP or the behavior of the bypass valve opening. The target opening value setting unit 24 holds, for example, the initial value (for example, 10[%]) of the target opening value, and sets the target opening value to the initial value at the time of the activation of the heat source system 1. Thereafter, when the header differential pressure ΔP or the bypass valve opening is changed depending on a required load or the like, the target opening value is changed depending on these states.

Figure 6:
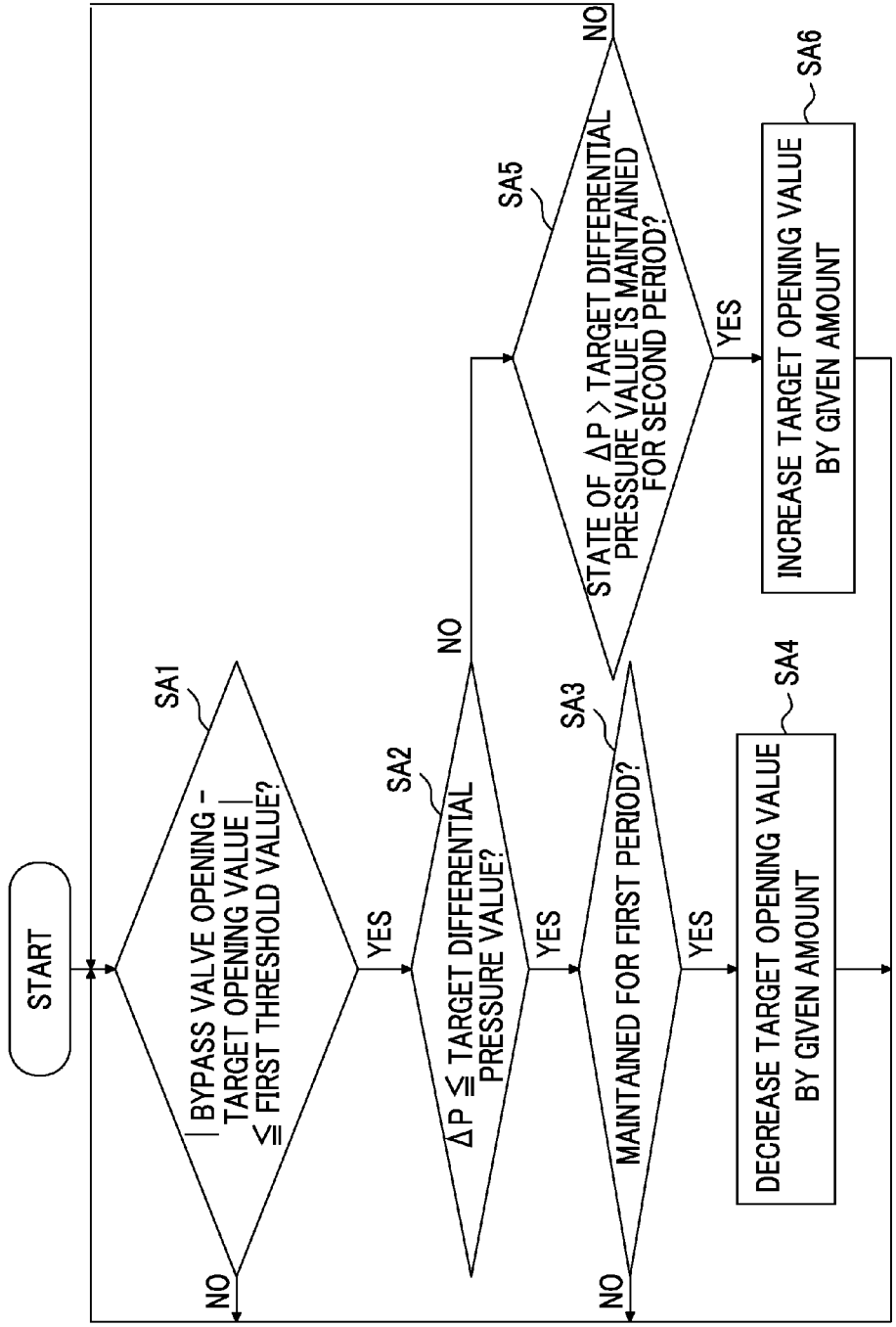
FIG. 6 is a flowchart showing a procedure of target opening value change processing which is executed by a target opening value setting unit.

For example, the change of the target opening value by the target opening value setting unit 24 is performed in accordance with a processing procedure shown in FIG. 6.

First, it is determined whether or not the absolute value of the deviation between the bypass valve opening and the target opening value is equal to or smaller than a first threshold value set in advance (Step SA1 of FIG. 6), and if the absolute value of the deviation between the bypass valve opening and the target opening value is equal to or smaller than the first threshold value (for example, within ±0.5[%] with respect to the target opening value), it is determined whether or not the header differential pressure ΔP is equal to or smaller than a target differential pressure value (for example, 200 [kPa]) set in advance (Step SA2). As a result, when the header differential pressure ΔP is equal to or smaller than the target differential pressure value, it is determined whether or not this state is maintained for a first period (for example, 60 [sec]) set in advance (Step SA3). As a result, when the state where the header differential pressure ΔP is equal to or smaller than the target differential pressure value is maintained for the first period, the target opening value decreases at a predetermined rate (for example, 0.1[% min]) by a given amount (Step SA4), and the process returns to Step SA1.

In Step SA2, when the header differential pressure ΔP is greater than the target differential pressure value, it is determined whether or not this state is maintained for a second period (for example, 60 [sec]) set in advance (Step SA5). As a result, when the state where the header differential pressure ΔP is greater than the target differential pressure value is maintained for the second period, the target opening value increases at a predetermined rate (for example, 0.1[% min]) by a given amount (Step SA6), and the process returns to Step SA1.

In Step SA1, when the absolute value of the deviation between the bypass valve opening and the target opening value is greater than a first threshold value, in Step SA3, when the above-described state is not maintained for the first period, and in Step SA5, when the above-described state is not maintained for the second period, the process returns to Step SA1 without changing the target opening value.

The first period and the second period described above may be set to the same value or may be set to different values.

Next, heating medium flow rate control which is executed by the host control device 20 having the respective functions described above will be described.

First, at the time of the activation, the preset initial value is set to the target opening value by the target opening value setting unit 24. The bypass valve opening command value based on the target differential pressure value and the header differential pressure ΔP is determined by the opening command value determination unit 22, and the heating medium flow rate set value according to the bypass valve opening command value is set by the heating medium flow rate setting unit 23.

The bypass valve is controlled on the basis of the bypass valve opening command value, whereby the header differential pressure ΔP is controlled so as to match the target differential pressure value. The frequency of each of the pumps 12a, 12b, and 12c is adjusted on the basis of the heating medium flow rate set value according to the bypass valve opening command value, whereby the heating medium flow rate adjustment is performed.

When this control is performed, the absolute value of the deviation between the bypass valve opening and the target opening value is equal to or smaller than the first threshold value ("YES" in Step SA1 of FIG. 6), and the state where the header differential pressure ΔP is equal to or smaller than the target differential pressure value is maintained for the first period ("YES" in Steps SA2 and SA3 of FIG. 6), the target opening value setting unit 24 decreases the target opening value by a predetermined amount. Hereinafter, the target opening value decreases successively by a predetermined amount insofar as the conditions of Steps SA1 to Step SA3 are satisfied.

As described above, if the target opening value decreases, the opening-flow rate characteristic which is referenced by the heating medium flow rate setting unit 23 is changed, and the heating medium flow rate set value for the same bypass valve opening command value decreases. Accordingly, the flow rate set value set by the heating medium flow rate setting unit 23 decreases, the rotational speed of each of the pumps 12a, 12b, and 12c is controlled in a decreasing direction, and the overall flow rate of the heating medium decreases.

If the overall flow rate of the heating medium decreases, the header differential pressure ΔP decreases. If the header differential pressure ΔP decreases, in order to allow the header differential pressure ΔP to match the target differential pressure value, the bypass valve opening command value is adjusted in a decreasing direction (closing direction). Accordingly, the bypass valve flow rate decreases. If the bypass valve flow rate decreases, the header differential pressure ΔP is changed to an increasing tendency. Then, a sequence of state changes is continued for a predetermined period, whereby, if the header differential pressure ΔP exceeds the target differential pressure value, in Step SA3 of FIG. 6, it is determined to be "NO", and the change of the target opening value is stopped.

Conversely, when the absolute value of the deviation between the bypass valve opening and the target opening value is equal to or smaller than the first threshold value ("YES" in Step SA1 of FIG. 6), and the state where the header differential pressure ΔP exceeds the target differential pressure value is maintained for the second period ("NO" in Step SA2 and "YES" in Step SA5), the target opening value setting unit 24 increases the target opening value by a predetermined amount (Step SA6). Subsequently, the target opening value increases successively by a predetermined amount insofar as the conditions of Steps SA1 and SA5 are satisfied.

As described above, if the target opening value increases, the opening-flow rate characteristic which is referenced by the heating medium flow rate setting unit 23 is changed, and the flow rate set value for the same bypass valve opening command value increases. Accordingly, the flow rate set value set by the heating medium flow rate setting unit 23 increases, and the rotational speed of the pump increases.

If the rotational speed of the pump increases, the overall flow rate of the heating medium increases, and the header differential pressure ΔP increases. If the header differential pressure ΔP increases, in order to allow the header differential pressure ΔP to match the target differential pressure value, the bypass valve opening command value is controlled in an increasing direction (opening direction). Accordingly, the bypass valve flow rate increases. If the bypass valve flow rate increases, the header differential pressure ΔP is changed to a decreasing tendency. Then, a sequence of state changes is continued for a predetermined period, whereby, if the header differential pressure ΔP is equal to or smaller than the target differential pressure value, in Step SA5 of FIG. 6, it is determined to be "NO", and the change of the target opening value is stopped.

As described above, according to the heat source system and the method of controlling a flow rate of a heating medium thereof of this embodiment, it becomes possible to allow the heating medium flow rate control to be completed on the heat source system side. Accordingly, it is not necessary to customize the adjustment of the bypass valve opening or the frequency control of the pump on the heat source system side in accordance with the scale or structure of the external load, and it is possible to propose a versatile system.

According to the heat source system of this embodiment, when the deviation between the bypass valve opening and the target opening value is equal to or smaller than the first threshold value, and the state where the header differential pressure ΔP is equal to or smaller than the target differential pressure value is maintained for the first period, control is performed to decrease the target opening value.

That is, in a state where the header differential pressure ΔP is equal to or smaller than the target differential pressure value, this represents a state where the bypass flow rate is excess, in other words, a state where the bypass valve 19 may be somewhat narrowed down. Accordingly, in this state, the bypass valve opening decreases to narrow down the bypass flow rate, and an excess heating medium flow rate absorbed as the bypass flow rate is absorbed by decreasing the rotational speed of each of the pumps 12a to 12c. In this way, the bypass valve opening is controlled in a closing direction as much as possible, and the heating medium flow rate increased by closing the bypass valve opening is absorbed by reducing the frequency of each of the pumps 12a to 12c, whereby it is possible to decrease power consumption of the pumps 12a to 12c, and to achieve energy saving.

For example, in a state where the target opening value is 10[%], when a bypass amount corresponds to 5[%] of a water flow rate (the flow rate supplied to the external load+the bypass amount), if the target opening value is narrowed down to 5[%], it is possible to reduce the bypass amount to 2.5[%] of the water flow rate. In this case, the pump can be operated with the heating medium flow rate decreased by 2.5[%] in a state where the same head is maintained. Accordingly, it is possible to reduce the inverter frequency of the pump by 1[%]. Since power consumption is in proportion to the third power of the frequency command, it becomes possible to reduce power consumption by 2[%].

Figure 7:
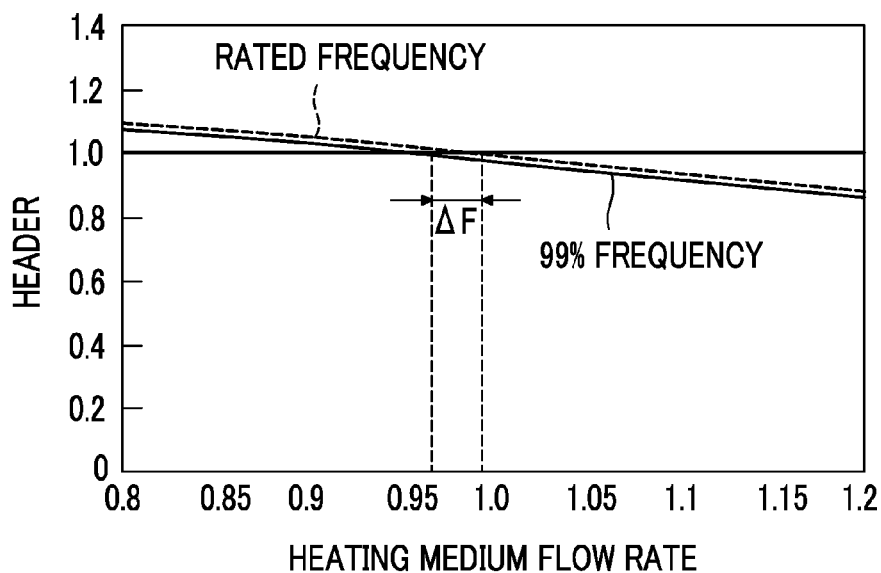
FIG. 7 is a diagram illustrating the effects of the heat source system according to the first embodiment of the invention.

FIG. 7 comparatively shows the relationship between the heating medium flow rate and the header when the pump is operated at a rated frequency and when the pump is operated at a 99% frequency. As shown in FIG. 7, for example, when the same header (=1.0) is maintained, it is possible to reduce the flow rate of $\Delta F$, and to reduce power consumption corresponding to the flow rate $\Delta F$.

[Second Embodiment]

Next, a heat source system and a method of controlling a flow rate of a heating medium flow rate thereof according to a second embodiment of the invention will be described.

In the above-described first embodiment, only the target opening value is changed, and the target differential pressure value is constant. In this embodiment, unlike the first embodiment, the target differential pressure value is also changed. Hereinafter, while description of the points, which are common to the first embodiment, will be omitted, points which are different from the first embodiment will be primarily described.

Figure 8:
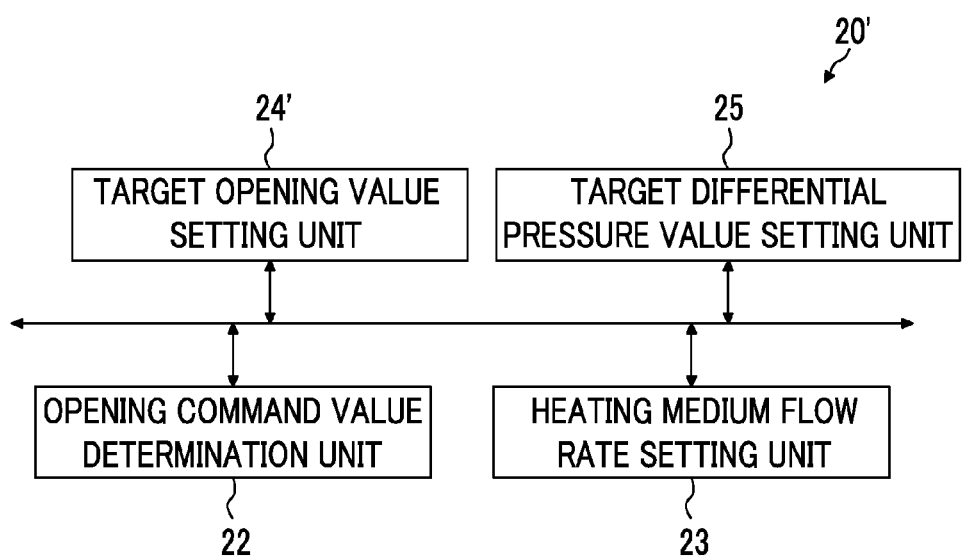
FIG. 8 is a functional block diagram primarily showing a function related to heating medium flow rate control in a host control device according to a second embodiment of the invention.

FIG. 8 is a functional block diagram primarily showing a function related to heating medium flow rate control in a host control device 20 according to this embodiment.

As shown in FIG. 8, a host control device 20' of this embodiment is different from the configuration shown in FIG. 3 in that a target differential pressure value setting unit 25 is further provided and a target opening value setting unit 24' further has a function of changing a target opening value with change of a target differential pressure value.

Figure 9:
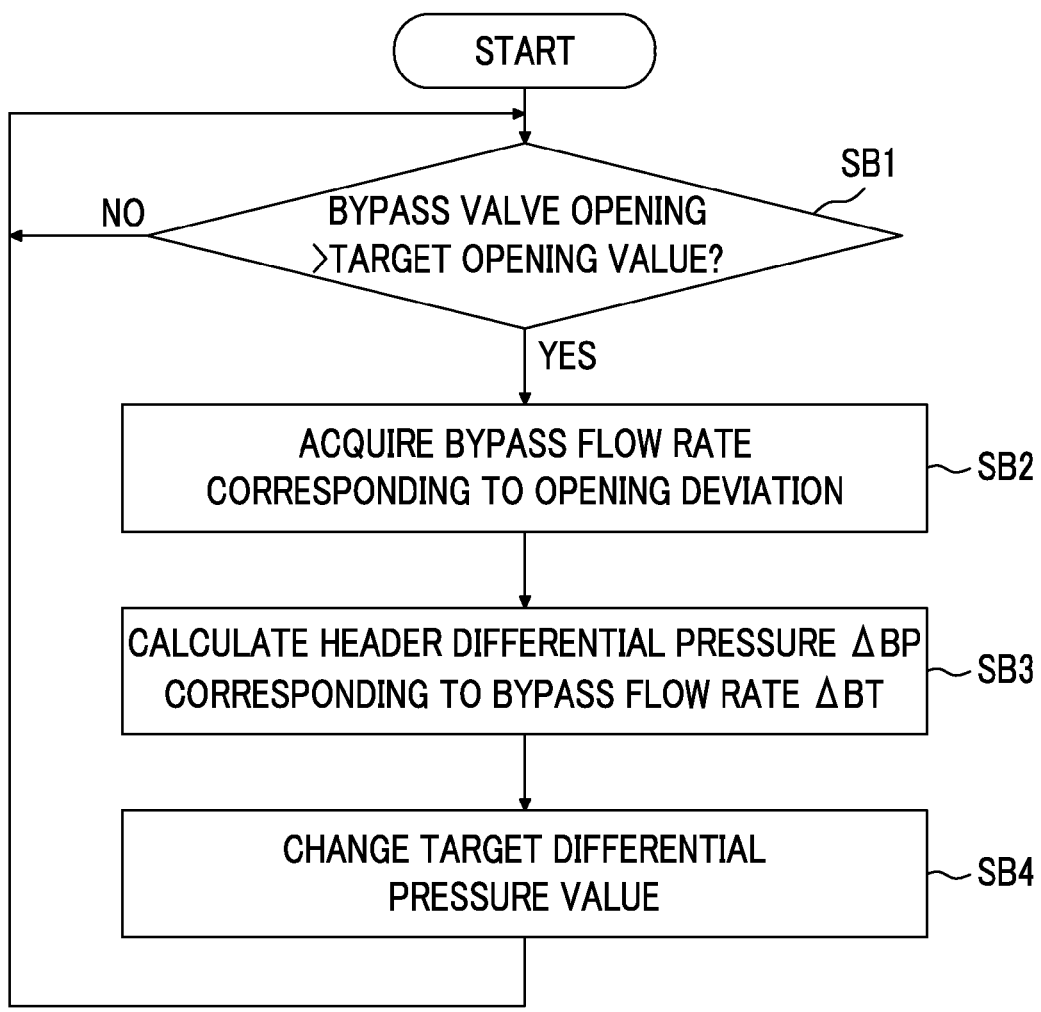
FIG. 9 is a flowchart showing a procedure of header target differential pressure value change processing by a target differential pressure value setting unit shown in FIG. 10.

For example, the change of the target differential pressure value by the target differential pressure value setting unit 25 is performed in accordance with a processing procedure shown in FIG. 9.

First, it is determined whether or not the bypass valve opening is greater than the target opening value (Step SB1 of FIG. 9), and when the bypass valve opening is greater than the target opening value, the bypass flow rate corresponding to the deviation between the bypass valve opening and the target opening value is acquired with reference to the opening-flow rate characteristic (see FIG. 5) held by the heating medium flow rate setting unit 23 (Step SB2 of FIG. 9). At this time, the opening-flow rate characteristic corresponding to the current target opening value set by the target opening value setting unit 24 is referenced.

Figure 10:
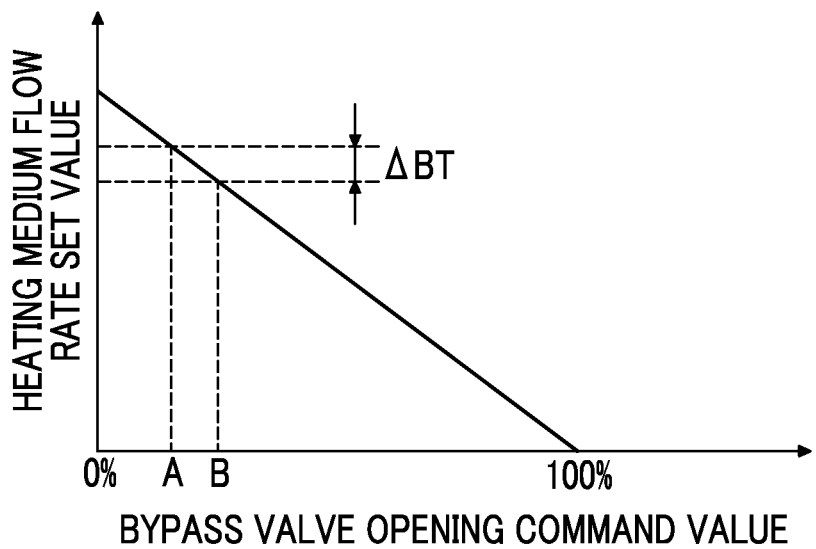
FIG. 10 is a diagram illustrating processing which is executed by the target differential pressure value setting unit.

For example, as shown in FIG. 10, when the current bypass valve opening is the opening A and the target opening value is the opening B, the bypass flow rate corresponding to the deviation becomes $\Delta BT$. Next, the target differential pressure value setting unit 25 calculates a header differential pressure $\Delta BP$ corresponding to the bypass flow rate $\Delta BT$ (Step SB3 of FIG. 9). For example, the target differential pressure value setting unit 25 holds an arithmetic expression of the header differential pressure $\Delta BP$ including the bypass flow rate $\Delta BT$ as a parameter, and calculates the header differential pressure $\Delta BP$ corresponding to the bypass flow rate $\Delta BT$ using the arithmetic expression. Subsequently, the target differential pressure value setting unit 25 decreases the current target differential pressure value with the header differential pressure $\Delta BP$ as a correction value (Step SB4 of FIG. 9), and the process returns to Step SB1.

Figure 11:
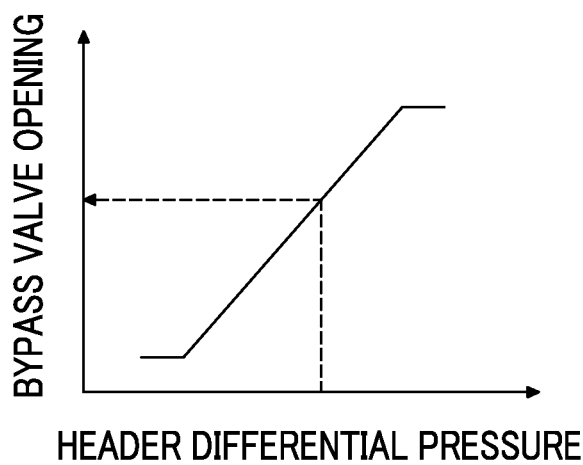
FIG. 11 is a diagram showing an example of a differential pressure-opening characteristic.

When the target differential pressure value is changed by the target differential pressure value setting unit 25, the target opening value setting unit 24' changes the target opening value on the basis of the changed target differential pressure value. Specifically, the target opening value setting unit 24' has a differential pressure-opening characteristic in which the relationship between the header differential pressure and the bypass valve opening is defined. FIG. 11 shows an example of a differential pressure-opening characteristic. In FIG. 11, the horizontal axis represents a header differential pressure (target differential pressure value), and the vertical axis represents a bypass valve opening. The differential pressure-opening characteristic is set such that, as the header differential pressure decreases, the bypass valve opening decreases. The differential pressure-opening characteristic may be held as a table as shown in FIG. 11 or may be held as an arithmetic expression of the bypass valve opening including the header differential pressure as a parameter.

When the target differential pressure value is changed by the target differential pressure value setting unit 25, the target opening value setting unit 24' acquires the bypass valve opening corresponding to the changed target differential pressure value from the differential pressure-opening characteristic, and changes the current target opening value to the acquired bypass valve opening.

Then, if the target opening value is changed in a decreasing direction, as described in the foregoing first embodiment, it is possible to decrease the rotational speed of the pump. Accordingly, it becomes possible to achieve energy saving.

As described above, according to the heat source system and the method of controlling a flow rate of a heating medium thereof of this embodiment, when the bypass valve opening is greater than the target opening value, the heating medium flow rate corresponding to the opening deviation is calculated, the header differential pressure $\Delta BP$ corresponding to the heating medium flow rate is calculated, and the target differential pressure value is updated in a decreasing direction depending on the header differential pressure $\Delta BP$. As the target differential pressure value decreases, the target opening value is changed in a decreasing direction.

In this way, if the target opening value is changed in a decreasing direction, it is possible to decrease the flow rate set value for the same bypass valve opening command value (see FIG. 5), and to reduce the rotational speed of each of the pumps 12a to 12c.

Figure 12:
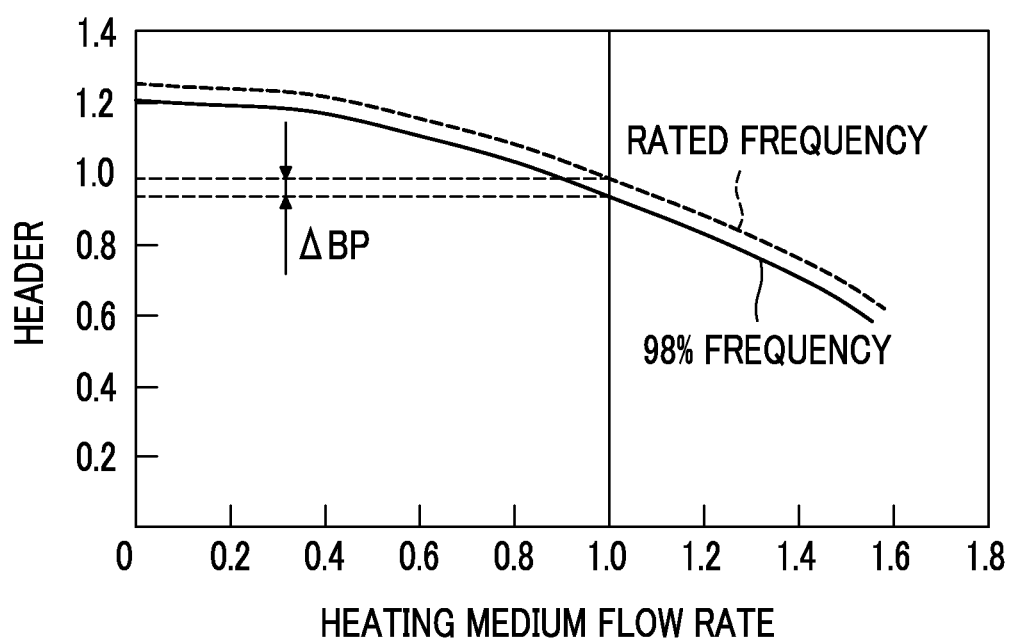
FIG. 12 is a diagram illustrating the effects of a heat source system according to the second embodiment of the invention.

For example, when the target differential pressure value is set to 200 [kPa], if it is assumed that the target differential pressure value is decreased by 10 [kPa] and the same heating medium flow rate is supplied, as shown in FIG. 12, it is possible to reduce the inverter frequency of the pump by 2[%] compared to a case where the rated flow rate is maintained. Furthermore, since power consumption is in proportion to the third power of the frequency command, it is possible to reduce power consumption by 6[%].

REFERENCE SIGNS LIST

1: heat source system
10a, 10b, 10c: heat source machine control device
11a, 11b, 11c: heat source machine
12a, 12b, 12c: pump
13: supply header
14: return header
18: bypass pipe
19: bypass valve
20, 20': host control device
22: opening command value determination unit
23: heating medium flow rate setting unit
24, 24': target opening value setting unit
25: differential pressure value setting unit

The invention claimed is:

1. A heat source system comprising:
heat source means for producing a heating medium at a desired temperature and supplying the heating medium to a load;
a first pipe which supplies the heating medium from the heat source means to the load;
a supply header which is provided in the first pipe;
a second pipe which supplies the heating medium used by the load to the heat source means;
a return header which is provided in the second pipe;
a bypass pipe which bypasses the heating medium from the supply header to the return header;
a bypass valve which is provided in the bypass pipe and adjusts the bypass flow rate of the heating medium;
a pump which is provided on an upstream side of a heating medium flow from the supply header in the first pipe or on a downstream side of a heating medium flow from the return header in the second pipe and has a variable rotational speed; and
control means for adjusting the opening of the bypass valve,
wherein the control means includes
opening command value determination means for determining a bypass valve opening command value such that a header differential pressure which is the differential pressure between the supply header and the return header matches a target differential pressure value,
target opening value setting means for setting a target opening value according to the header differential pressure or the behavior of the bypass valve opening, and
heating medium flow rate setting means for holding an opening-flow rate characteristic in which the relationship between a bypass valve opening command value and a heating medium flow rate set value is defined in association with a target opening value, and acquiring the heating medium flow rate set value corresponding to the valve opening command value determined by the opening command value determination means using the opening-flow rate characteristic corresponding to the target opening value set by the target opening value setting means, and
wherein the heating medium, the flow rate of which is adjusted to the heating medium flow rate set value by the frequency control of the pump performed in accordance with the heating medium flow rate set value, is supplied to the supply header through the first pipe.

2. The heat source system according to claim 1,
wherein the target opening value setting means decreases the current target opening value when the deviation between the bypass valve opening and the target opening value is within a predetermined range set in advance, and the state where the header differential pressure is equal to or smaller than the target differential pressure value is maintained for a predetermined first period, and
the opening-flow rate characteristic is set such that, as the target opening value decreases, the heating medium flow rate set value for the same bypass valve opening command value decreases.

3. The heat source system according to claim 2, further comprising:
target differential pressure value setting means for calculating a header differential pressure corresponding to a heating medium flow rate according to the deviation between the bypass valve opening and the target opening value when the bypass valve opening is greater than the target opening value, and decreases the target differential pressure value using the header differential pressure as a correction value,
wherein the target opening value setting means has a differential pressure-opening characteristic in which the relationship between the header differential pressure and the bypass valve opening is defined, when the target differential pressure value is changed by the target differential pressure value setting means, acquires a bypass valve opening corresponding to the changed target differential pressure value from the differential pressure-opening characteristic, and sets the acquired bypass valve opening as the target opening value, and
the differential pressure-opening characteristic is set such that, as the target differential pressure value decreases, the target opening value decreases.

4. The heat source system according to claim 1, further comprising:
target differential pressure value setting means for calculating a header differential pressure corresponding to a heating medium flow rate according to the deviation between the bypass valve opening and the target opening value when the bypass valve opening is greater than the target opening value, and decreases the target differential pressure value using the header differential pressure as a correction value,
wherein the target opening value setting means has a differential pressure-opening characteristic in which the relationship between the header differential pressure and the bypass valve opening is defined, when the target differential pressure value is changed by the target differential pressure value setting means, acquires a bypass valve opening corresponding to the changed target differential pressure value from the differential pressure-opening characteristic, and sets the acquired bypass valve opening as the target opening value, and
the differential pressure-opening characteristic is set such that, as the target differential pressure value decreases, the target opening value decreases.

5. A method of controlling a flow rate of a heating medium which is applied to a heat source system,
wherein the heat source system includes
heat source means for producing a heating medium at a desired temperature and supplying the heating medium to a load,
a first pipe which supplies the heating medium from the heat source means to the load,
a supply header which is provided in the first pipe,
a second pipe which supplies the heating medium used by the load to the heat source means,
a return header which is provided in the second pipe,
a bypass pipe which bypasses the heating medium from the supply header to the return header, a bypass valve which is provided in the bypass pipe and adjusts the bypass flow rate of the heating medium, a pump which is provided on an upstream side of a heating medium flow from the supply header in the first pipe or on a downstream side of a heating medium flow from the return header in the second pipe and has a variable rotational speed, and control means for adjusting the opening of the bypass valve, the method comprises:

an opening command value determination step of determining a bypass valve opening command value such that a header differential pressure which is the differential pressure between the supply header and the return header matches a target differential pressure value;

a target opening value setting step of setting a target opening value according to the header differential pressure or the behavior of the bypass valve opening; and a heating medium flow rate setting step of holding an opening-flow rate characteristic in which the relationship between a bypass valve opening command value and a heating medium flow rate set value is defined in association with a target opening value, and acquiring the heating medium flow rate set value corresponding to the valve opening command value determined in the opening command value determination step using the opening-flow rate characteristic corresponding to the target opening value set in the target opening value setting step, and the frequency control of the pump is performed in accordance with the heating medium flow rate set value.

* * * * *